US009553565B2

(12) United States Patent
de Ruijter et al.

(10) Patent No.: US 9,553,565 B2
(45) Date of Patent: Jan. 24, 2017

(54) AUTOMATIC FREQUENCY COMPENSATION METHOD AND APPARATUS

(75) Inventors: Hendricus de Ruijter, Sunnyvale, CA (US); Wentao Li, Mountain House, CA (US)

(73) Assignee: Silicon Laboratories Inc., Austin, TX (US)

( * ) Notice: Subject to any disclaimer, the term of this patent is extended or adjusted under 35 U.S.C. 154(b) by 780 days.

(21) Appl. No.: 13/249,215

(22) Filed: Sep. 29, 2011

(65) Prior Publication Data

US 2013/0083874 A1    Apr. 4, 2013

(51) Int. Cl.
*H03J 7/04* (2006.01)
*H03J 7/00* (2006.01)
*H03J 7/02* (2006.01)

(52) U.S. Cl.
CPC .. *H03J 7/04* (2013.01); *H03J 7/00* (2013.01); *H03J 7/02* (2013.01)

(58) Field of Classification Search
CPC ............. H03J 7/00; H03J 7/02; H03L 7/00; H04W 56/0035
USPC ............ 375/260, 267, 272, 320, 344, 376
See application file for complete search history.

(56) References Cited

U.S. PATENT DOCUMENTS

| | | | |
|---|---|---|---|
| 4,868,523 A * | 9/1989 | Petersson | H03L 7/199 331/14 |
| 4,887,050 A | 12/1989 | Borth et al. | |
| 4,949,051 A * | 8/1990 | Viola | H03L 7/14 327/165 |
| 5,423,085 A | 6/1995 | Lim | |
| 2006/0198482 A1* | 9/2006 | Meltzer | H03L 7/087 375/376 |
| 2006/0215778 A1* | 9/2006 | Murthy | G06F 1/0353 375/260 |
| 2010/0080309 A1 | 4/2010 | Moffatt et al. | |
| 2010/0330931 A1* | 12/2010 | Uehara | G01S 19/23 455/75 |
| 2010/0331032 A1* | 12/2010 | Lipka | H04W 56/0035 455/509 |
| 2011/0299639 A1* | 12/2011 | Maleysson | H03J 7/065 375/344 |
| 2012/0106678 A1* | 5/2012 | Currivan | H04L 27/0014 375/320 |
| 2012/0300869 A1* | 11/2012 | Orino | H03J 7/04 375/272 |

(Continued)

FOREIGN PATENT DOCUMENTS

EP    2343803    7/2011

*Primary Examiner* — Daniel Washburn
*Assistant Examiner* — Eboni Hughes
(74) *Attorney, Agent, or Firm* — Meyertons, Hood, Kivlin, Kowert & Goetzel, P.C.

(57) ABSTRACT

A method an apparatus for performing automatic frequency compensation (or control) is disclosed. A method and apparatus for performing automatic frequency compensation (or control) is disclosed. In one embodiment, a method includes a radio receiver receiving a radio signal and detecting a preamble in the radio signal. The method further includes freezing an automatic frequency compensation (AFC) loop responsive to detecting the preamble. A clock source of the AFC loop may be switched from a first clock signal to a second clock signal. The method further includes subsequently unfreezing the AFC loop.

21 Claims, 5 Drawing Sheets

(56) References Cited

U.S. PATENT DOCUMENTS

2012/0320955 A1* 12/2012 Ueda ................ H04W 52/0274
　　　　　　　　　　　　　　　　　　　　　375/219

* cited by examiner

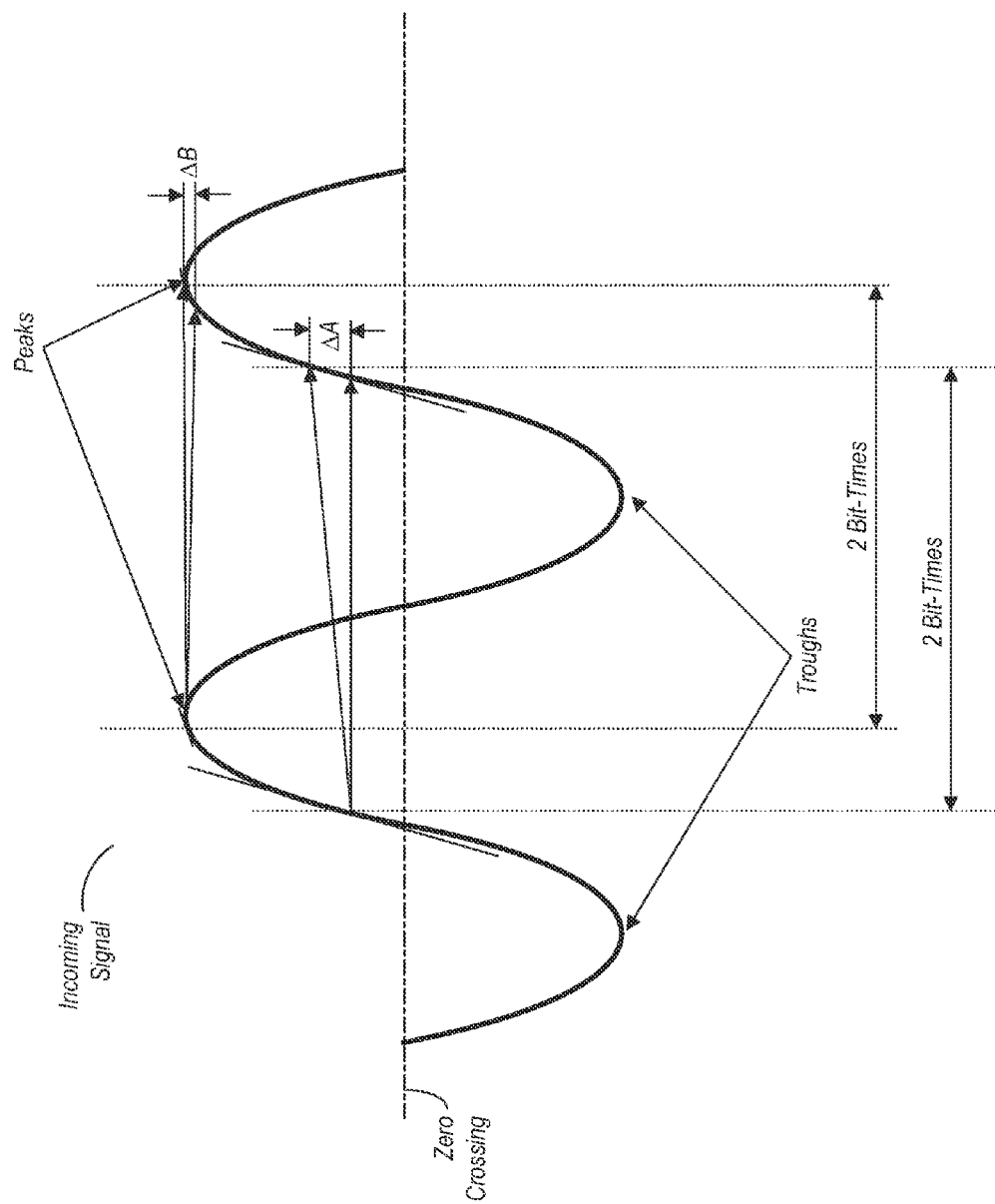

AUTOMATIC FREQUENCY COMPENSATION METHOD AND APPARATUS

BACKGROUND

1. Field of the Invention

This invention relates to radio receivers, and more particularly, to automatic frequency compensation in radio receivers.

2. Description of the Related Art

Automatic frequency compensation (AFC; sometimes referred to as automatic frequency control) is a technique used in radio communications system to minimize the difference between the frequency of an oscillator and a desired frequency. In radio receivers, AFC may be used to control the frequency of a local oscillator such that it is as close as possible to the desired radio frequency such that the received signal frequency is in the center of a frequency response of a channel filter. In one embodiment of a basic AFC loop, a local oscillator may be implemented using a voltage-controlled oscillator (VCO). A difference between the receiver center frequency and the incoming signal frequency may be sensed and converted into a control voltage. This control voltage may then be provided to the local oscillator in order to adjust the frequency. In general, the AFC loop may operate as a closed-loop feedback system.

In digital radio communications systems, a known data sequence referred to as a preamble may be transmitted to the receiver. The preamble may be periodically transmitted (e.g., with each frame of data). The preamble may be used for synchronization of the incoming data. In addition, some digital communications systems may be utilized to settle the AFC loop. Incoming data may be sampled, for example, every two symbols, with a difference computed between the samples in order to determine an offset, which can then be used to set the control voltage provided to the VCO.

SUMMARY OF THE DISCLOSURE

A method and apparatus for performing automatic frequency compensation (or control) is disclosed. In one embodiment, a method includes a radio receiver receiving a radio signal and detecting a preamble in the radio signal. The method further includes freezing an automatic frequency compensation (AFC) loop responsive to detecting the preamble. A clock source of the AFC loop may be switched from a first clock signal to a second clock signal. The method further includes subsequently unfreezing the AFC loop.

In one embodiment, a radio receiver includes an AFC loop coupled to receive a radio signal, wherein the AFC loop includes a frequency difference circuit. The receiver further includes a multiplexer coupled to provide one of a first clock signal or a second clock signal to the frequency difference circuit. A preamble circuit is configured to detect a preamble in the radio signal. The preamble circuit is configured to cause the multiplexer to switch from providing first clock signal to the AFC loop prior to detecting the preamble to providing the second clock signal to the AFC loop subsequent to detecting the preamble.

A radio receiver having a frequency difference circuit is also disclosed. The frequency difference circuit is coupled to receive an indication of a frequency of a filtered intermediate frequency (IF) signal, and further coupled to receive a first clock signal or a second clock signal from a multiplexer. A demodulator is configured to demodulate the filtered IF signal to provide an output data stream. The radio receiver also includes a preamble circuit configured to detect a preamble in the output data stream. The preamble circuit is configured to cause the multiplexer to provide the first clock signal to the frequency difference circuit prior to detecting the preamble. The preamble circuit is further configured to cause the multiplexer to provide the second clock signal to the frequency difference circuit subsequent to detecting the preamble.

BRIEF DESCRIPTION OF THE DRAWINGS

Other aspects of the disclosure will become apparent upon reading the following detailed description and upon reference to the accompanying drawings, which are now briefly described.

FIG. 5 is a graphic illustration of the error obtained by sampling an incoming signal at various points.

Figure 1:
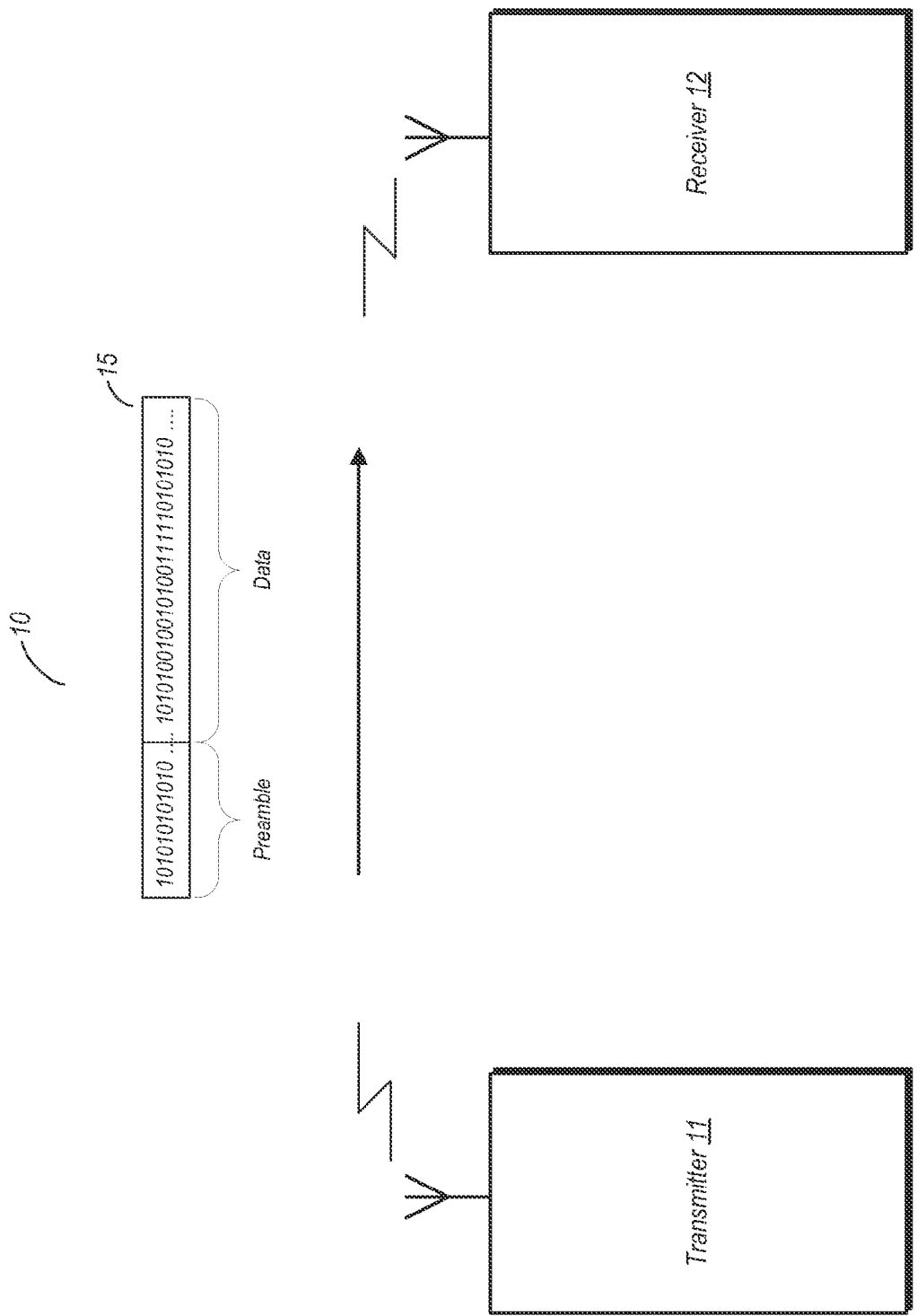
FIG. 1 is a block diagram of a basic radio communications system for conveying digital data.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Turning now to FIG. 1, a block diagram of a basic radio communications system for conveying digital data is illustrated. In the embodiment shown, communications system 10 includes a transmitter 11 that is configured to transmit information via radio signals or radio frequency (RF) signals. A receiver 12 is configured to receive transmitted radio signals or RF signals and to recover the information carried therein. In the embodiment shown, a carrier signal may be subject to frequency modulation (FM) by information to be conveyed in order to produce the transmitted radio signal, although other modulation schemes may be used as would be understood by one of ordinary skill in the art.

Communications system 10 in the exemplary embodiment shown is a digital communications system. Information to be transmitted to receiver 12 may be arranged in packets, frames, or any other suitable format. In this particular example, digital data is formatted into a generic information block 15 that includes a preamble and data. The preamble may be a pattern of alternating logic 1's and logic 0's. The data may include the payload (i.e. the actual information to be recovered and provided to a user) as well as other information such as a synchronization word. The preamble and data sections may be any suitable length. For example, if information block is an Ethernet frame, the preamble may include seven octets of the pattern '10101010', followed by various other fields of data (e.g., a destination address) and the payload data itself.

Data may be transmitted from transmitter 11 to receiver 12 in a series of information blocks 15 (e.g., packets, frames, or other types). In transmitter 11, the digital data to be conveyed may be used to modulate a carrier signal. The modulated carrier signal may then be transmitted wirelessly and detected and recovered by receiver 12. During the reception of an information blocks 15, an automatic frequency compensation (AFC) procedure may be performed to improve the receiver sensitivity and thus increase the ability of the receiver to recover the data without errors. As will be discussed in further detail below, the preamble of each received information blocks 15 may be utilized in performance of the AFC procedure.

In general, communications system 10 may be one of a wide variety of wireless digital communications system. Such communications systems may include wireless routers, cellular phones/smartphones, digital 2-way radio, and virtually any other type of wireless digital communications system.

Figure 2:
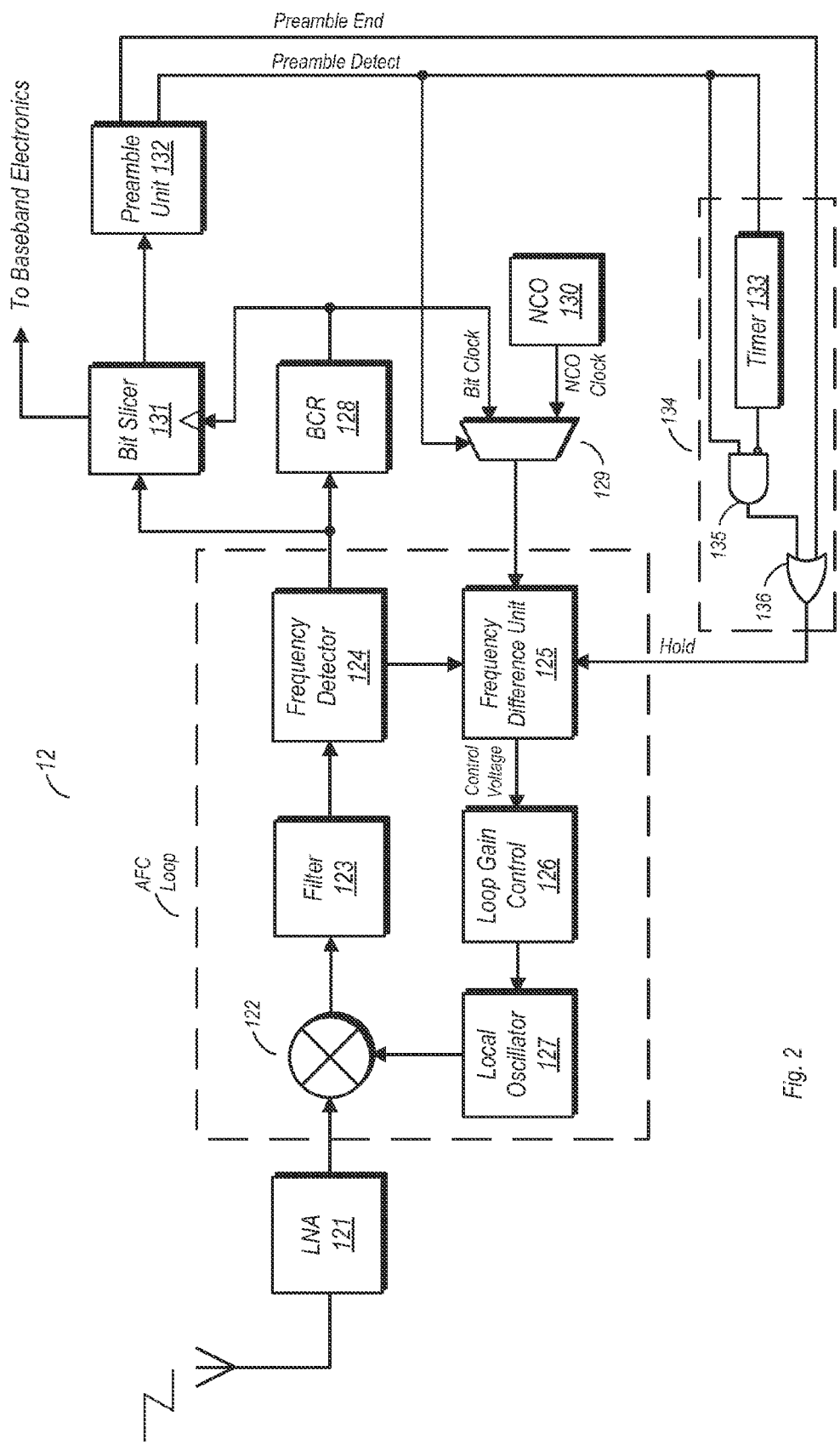
FIG. 2 is a block diagram of one embodiment of a radio receiver.

FIG. 2 is a block diagram of one embodiment of receiver 12. In the embodiment shown, receiver 12 includes an AFC loop operable to perform an AFC procedure to improve overall receiver sensitivity. The procedure may be performed using the preamble, and may be performed in two different portions. A first portion of the AFC procedure may be performed using a first clock signal and a second portion may be performed using a second clock signal. During the second portion, incoming data may be sampled at or near a peak or trough (i.e. minimum) of an incoming modulated signal. By sampling near the peak and/or trough, sampling errors may be reduced relative to sampling closer to the zero crossings of the modulated signal. This in turn may lead to greater accuracy in the AFC procedure.

Receiver 12 in the embodiment shown include a low noise amplifier (LNA) 121 coupled to receive an incoming radio signal from an antenna. LNA 121 may amplify the received radio signal and provide an amplified version thereof to mixer 122. Local oscillator 127 may provide a periodic signal that may be mixed with the incoming radio signal in order to produce a mixer output signal. The mixer output signal may be a down-converted (i.e. reduced frequency) version of the radio signal. In one embodiment, receiver 12 may be a heterodyne receiver (e.g., a low-IF receiver, etc.), and thus the mixer output signal is an intermediate frequency (IF) signal. In another embodiment, receiver 12 may be a direct-conversion receiver, and the mixer output signal may be a baseband signal.

Filter 123 is coupled to receive the mixer output signal from mixer 122. For the case in which receiver 12 is a heterodyne receiver, filter 123 is a bandpass filter having the IF as the center frequency. For the case in which receiver 12 if a direct conversion receiver, filter 123 is a low pass filter configured to pass frequencies at the baseband. In either case, filter 123 may filter out frequencies outside of its pass band, thereby outputting a filtered version of the mixer output signal. In one embodiment, the bandwidth of filter 123 may be adjustable. Initially (e.g., at the beginning of a packet/frame), the bandwidth of filter 123 may be relatively wide. Upon detection of the preamble, filter 123 may be adjusted to have a narrower bandwidth. Accordingly, filter 123 may be coupled to receive the 'Preamble Detect' signal from preamble circuit 132, although this is not explicitly shown in the FIG. 1. Utilizing a wider bandwidth at the beginning of a packet/frame may increase the AFC capture range, and may allow receiver 12 to function with transmitters that are less accurate with regard to the carrier frequency of a transmitted signal. Subsequently narrowing the filter may increase the sensitivity and selectivity of receiver 12.

Frequency detector 124 in the embodiment shown is coupled to receive the filtered version of the mixer output signal. Among the functions performed by frequency detector 124 is a determination of the frequency of the mixer output signal, as well as a determination of the frequency error. The frequency error may be the difference between the frequency of the mixer output signal and the center frequency of filter 123 (which may correspond to a desired tuning frequency). In some embodiments, in lieu of a frequency detector, receiver 12 may implement a phase detector, which may also determine the frequency error. However, in either case, the functionality implemented therein my include determining the frequency of the received mixer output signal. More generally, frequency detector 124 (or the phase detector in other embodiments) may be one of any different type of frequency/phase detectors used to perform a detection function of an FM signal.

Frequency difference circuit 125 in the embodiment shown is coupled to receive an indication of the frequency error from frequency detector 124. In addition, frequency difference circuit 125 is coupled to receive one of two different clock signals from multiplexer 129. Using the indication received from frequency detector 124, frequency difference circuit 125 may use the received clock signal to cancel out a modulation component from the frequency error. Thus, frequency difference circuit 125 may determine a true frequency error since the frequency error determined by frequency detector 124 may include an offset corresponding to the modulation component. Frequency difference circuit 125 may generate a control voltage based on the true frequency error in which the modulation component is canceled out. The control voltage may be amplified by loop gain control circuit 126 and provide to local oscillator 127. Local oscillator 127 may provide as its output the periodic signal to mixer 122 at a frequency that is based on the control voltage. In some embodiments, a digital representation of the control voltage may be provided to loop gain control circuit 126 in lieu of an actual analog control voltage. In exemplary embodiments, the control voltage may be either analog or digital (and analog or digital representation may be used).

Changes to the control voltage may cause a change to the frequency of the periodic signal and therefore the frequency of the mixer output signal. Thus, when the AFC loop is closed, it may operate as a feedback control system that attempts to adjust the mixer output frequency to a desired frequency based on the frequency of the clock signal provided to frequency difference circuit 125. Thus, tuning of receiver 12 may be accomplished by adjustments to the frequency of the clock signal hat is provided to frequency difference circuit 125.

In addition to providing the indication to frequency difference circuit 125, frequency detector 124 is coupled to provide the mixer output signal to bit slicer 131. In the embodiment shown, frequency detector 124 and bit slicer 131, working together, may essentially perform a demodulation function by recovering the modulating data from the mixer output signal. More particularly, bit slicer 131 may sample the incoming signal and make a decision as to whether the sampled data is a logic 1 or a logic 0. Bit slicer 131 may then output the data at the decided logic values to a baseband electronics circuit where further processing (e.g., conversion to voice audio) may be performed.

Sampling of data by bit slicer 131 may be performed in accordance with a bit clock signal provided by bit clock recovery (BCR) circuit 128. The bit clock output by BCR circuit 128 may be derived from the incoming mixer output signal, and more particularly, from the preamble. As previously noted, the preamble may be an alternating sequence of logic 1's and 0's (e.g., 101010 . . . ). BCR circuit 128 may detect this sequence and may attempt to lock onto this sequence. When BCR circuit 128 is in phase with this sequence (i.e. locked onto), the bit clock may be output therefrom at the proper phase and frequency.

In addition to providing data to baseband electronics, bit slicer 131 may also provide data to preamble circuit 132. In the embodiment shown, preamble circuit 132 provides several functions. One of these functions is initial detection of the preamble. When a frame or packet is initially received, there may be some frequency error between the desired and actual frequency of the mixer output signal containing the packet/frame. Thus, the symbols (e.g., logic values) of the packet/frame may not be spaced in time in accordance to the desired tuning frequency. This may cause bit slicer 131 to produce erroneous data for at least some of the initial samples. As the AFC procedure reduces the error between the desired and actual frequencies of the mixer output signal, the preamble may be detected. Upon detection of the preamble, a detection signal ('Preamble Detect') may be asserted.

A second function performed by the preamble circuit 132 is the detection of the end of the preamble. Once it is determined that the data pattern of the preamble is no longer being repeated, preamble circuit 132 may indicate the end of the preamble by asserting another signal ('Preamble End').

Multiplexer 129 in the illustrated embodiment is coupled to receive the detection signal on its selection input. A first clock signal is provided to a first data input of multiplexer 129 is that which is provided from numerically controlled oscillator (NCO) 130. NCO 130 is configured to generate a clock signal according to a numeric input (not shown here). While the numeric input may set the desired frequency of the NCO clock signal, NCO 130 is otherwise a free-running oscillator that operates independent of the other illustrated circuits of receiver 12.

A second data input of multiplexer 129 is coupled to receive the bit clock from the bit clock generator. During a first portion of the AFC procedure performed in receiver 12, the 'Preamble Detect' signal is de-asserted. When the 'Preamble Detect' signal is de-asserted, multiplexer 129 selects the NCO clock, which is then output to frequency difference circuit 125. Upon detection of the preamble and resultant assertion of the 'Preamble Detect' signal, multiplexer 129 selects the bit clock to be output to frequency difference circuit 125.

Receiver 12 in the embodiment shown also includes a hold circuit 134. Hold circuit 134 is configured to assert a hold signal ('Hold') to cause an opening, or freezing, of the AFC loop. The 'Hold' signal is received by frequency difference circuit 125. When frequency difference circuit 125 detects the assertion of the 'Hold' signal, it may hold the control voltage at a steady value, irrespective of the clock input from multiplexer 129 and the frequency indication provided by frequency detector 124. Since frequency difference circuit 125 does not respond to either the desired frequency input (as indicated by the clock signal received from multiplexer 129) or the frequency indication received from frequency detector 124 when the 'Hold' signal is asserted, the AFC loop is effectively open at this point of operation, as the control voltage is frozen (i.e. held at a steady value).

Hold circuit 134 may assert the 'Hold' signal in two different cases. During the first portion of an AFC procedure, the 'Preamble Detect' signal is de-asserted, as the preamble has not yet been detected. Furthermore, timer 133 of hold circuit 134 is inactive at this time. When the preamble is detected and the 'Preamble Detect' signal asserted, a logic 1 value is provide to one input of AND gate 135. The other input, from the output of timer 133, is inverted from a logic 0 to a logic 1. Accordingly, when the hold circuit 134 detects assertion of the 'Preamble Detect' signal, AND gate 135 outputs a logic 1, which propagates through OR gate 136 and thus causes assertion of the 'Hold' signal.

Assertion of the 'Preamble Detect' signal also initiates the operation of timer 133. Although not explicitly shown here, timer 133 may be coupled to receive a clock signal, such as the bit clock signal, and may operate for a predetermined duration from the time of the assertion of the 'Preamble Detect' signal. Once the predetermined duration has elapsed, timer 133 may assert a logic 1 on is output. This logic 1 may be inverted an provided as an input into AND gate 135. As a result, AND gate 135 outputs a logic 0. Since the 'Preamble End' signal is not asserted at this time, OR gate 136 also outputs a logic 0 as a result of the 1 to 0 transition of the output of AND gate 135. Accordingly, the 'Hold' signal is de-asserted at this point of operation. The 'Hold' signal may remain de-asserted until preamble circuit 132 asserts the 'Preamble End' signal upon detecting the end of the preamble. When the 'Preamble End' signal is asserted, OR gate 136 outputs a logic 1, thereby re-asserting the 'Hold' signal and thus causing the AFC loop to be opened again. The AFC loop may remain open as the remaining portion of the incoming packet/frame is received. Preamble circuit 132 may detect the end of the incoming packet/frame, and may respond be de-asserting both of the 'Preamble Detect' and 'Preamble End' signals, thereby allowing the AFC loop to be closed for performing the AFC procedure for the next packet/frame received. It is noted that in some embodiments, preamble circuit 132 may not be configured to assert a 'Preamble End' signal. In such embodiments, an AFC procedure may be performed to the end of each received packet/frame.

Figure 3:
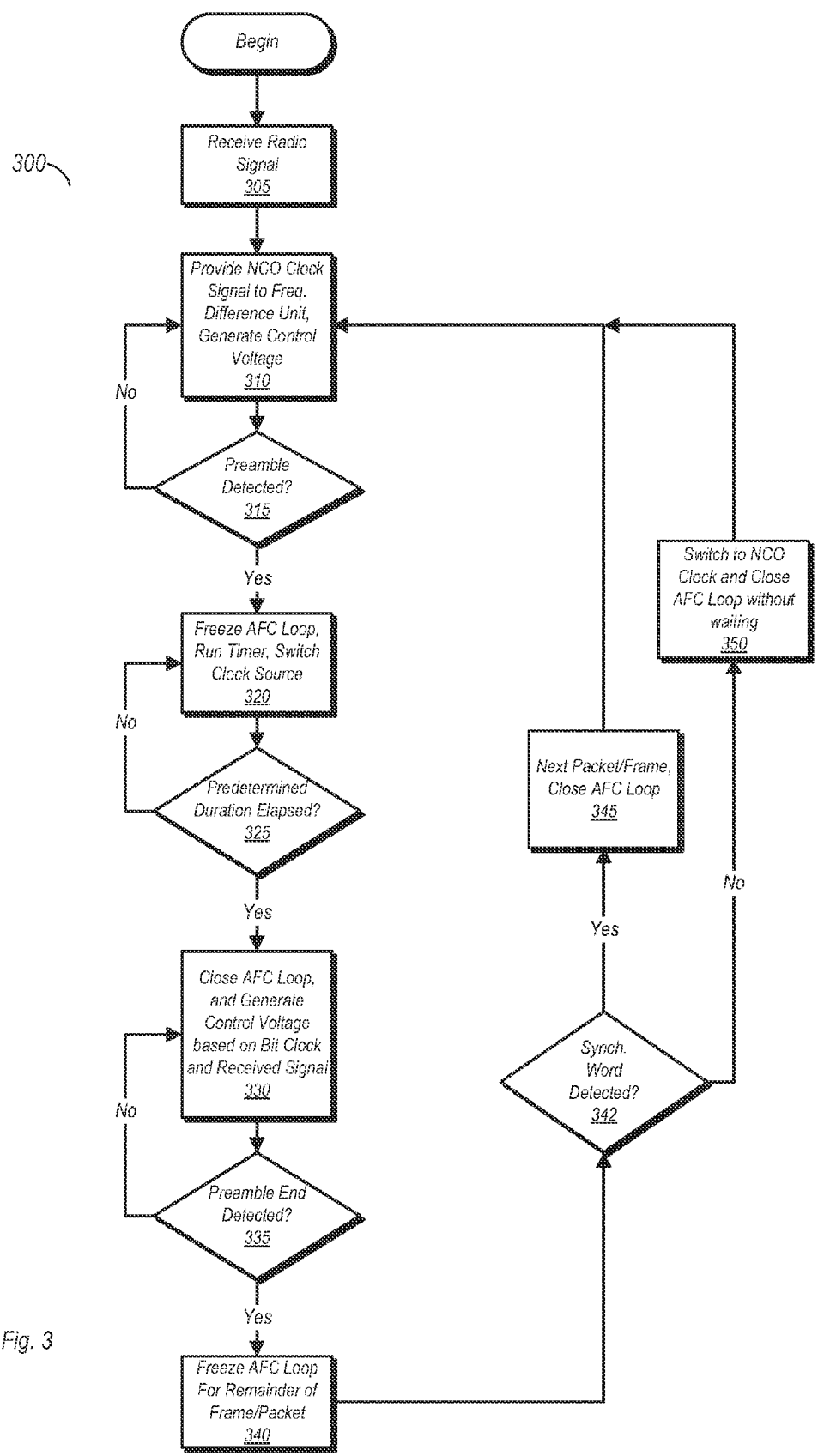
FIG. 3 is a flow diagram illustrating one embodiment of a method for performing automatic frequency compensation in a radio receiver.
Figure 4:
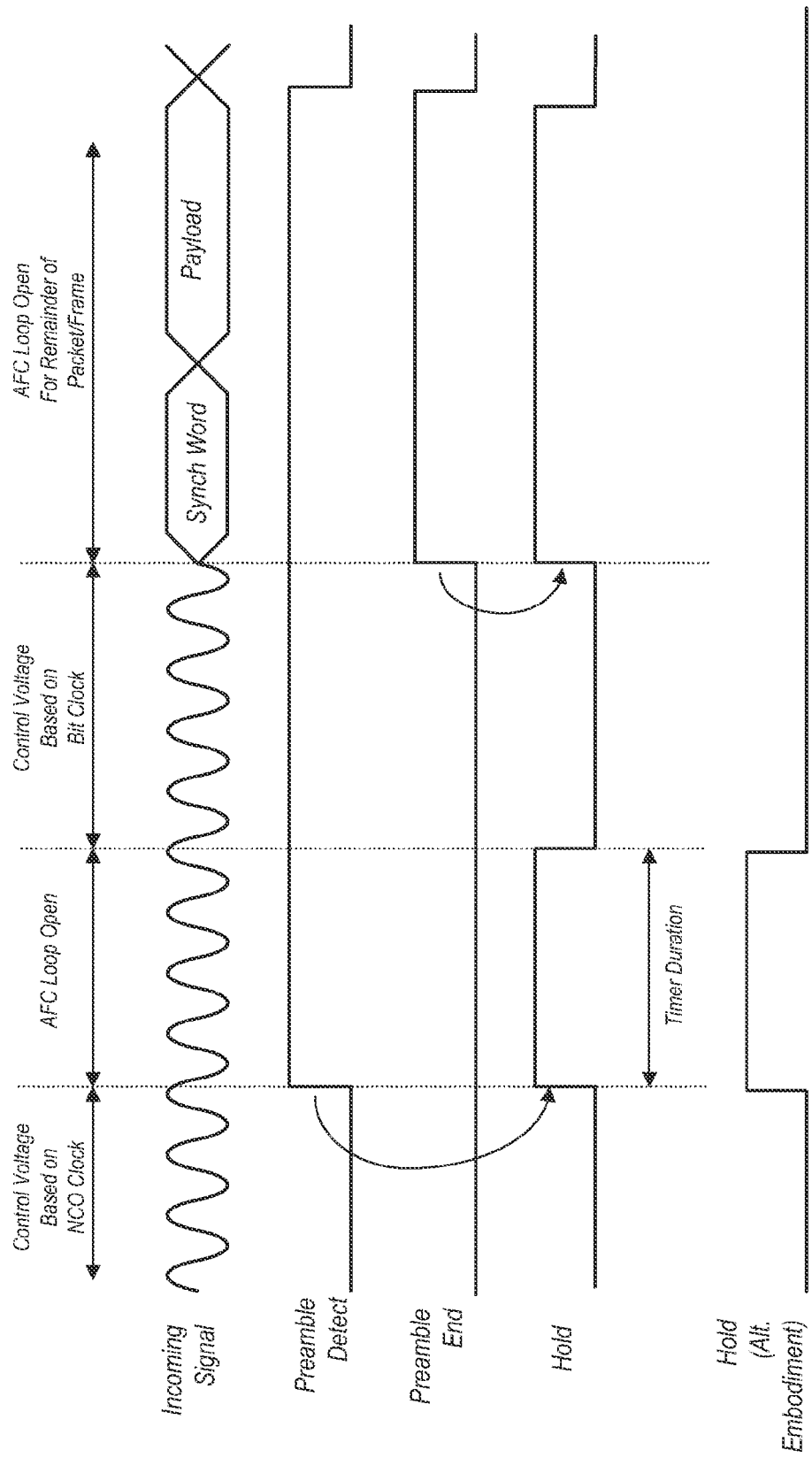
FIG. 4 is a timing diagram further illustrating an embodiment of a method for performing automatic frequency compensation.

The AFC procedure is now further explained in conjunction with FIGS. 3 and 4. Turning now to FIG. 3, a flow diagram of an embodiment of a method for performing the AFC procedure is illustrated. The embodiment of the method is discussed herein in the context of receiver 12 shown in FIG. 2. It is noted however that the described methodology may be applicable to other receiver embodiments as well.

Method 300 begins with the receiving of a radio signal that may be carrying formatted digital data in frames or packets (block 305). As the AFC procedure commences, the NCO clock signal is provided by NCO 130 to frequency difference circuit 125 by way of multiplexer 129, with frequency difference circuit 125 generating a corresponding control voltage (block 310). The control voltage generated by frequency difference circuit 125 may be based on the difference between the center frequency of filter and the frequency of the mixer output signal received by frequency detector 124. Using the NCO clock signal, frequency difference circuit 125 may remove a modulation component from the frequency error determined by frequency detector 124 in order to produce a more accurate indication of the frequency error. Thus, the control voltage signal may be based on the frequency error with the modulation component canceled therefrom. The control voltage signal may be provided to loop gain control circuit 126, where it is amplified and then provided to local oscillator 127. In turn, local oscillator 127 may output a periodic signal to mixer 122 at a frequency dependent upon the amplified control voltage signal. Mixer 122 may also receive an amplified version of the radio signal, mixing it with the periodic signal from the local oscillator and outputting a corresponding signal at a reduced frequency (either IF or baseband).

During this portion of the AFC procedure, the preamble may be received, although not yet detected. If the preamble has not yet been detected by preamble circuit 132 (block 315, no), the method continues at block 310, with the NCO clock signal being provided to frequency difference circuit 125. Using the NCO clock and the feedback provided in the form of the frequency error indication from frequency detector 124, the frequency of the mixer output signal may be adjusted (i.e. tuned) toward the desired frequency. Furthermore, bit slicer 131 may output bits at detected logic values to preamble circuit 132, while BCR 128 may attempt to lock phase with the incoming preamble signal in order to generate the bit clock at the correct frequency.

Once the preamble signal is detected by preamble circuit 132 (block 315, the "Yes" path), the AFC loop is frozen (i.e. opened) and the source of the clock signal is switched from the NCO clock to the bit clock (block 320). When the AFC loop is opened, frequency difference circuit 125 is inhibited from changing the control voltage, regardless of the frequency of the clock signal received from multiplexer 129 or the frequency error indication received from frequency detector 124. Opening the AFC loop may occur responsive to preamble circuit 132 asserting the 'Preamble Detect' signal. Responsive to assertion of the 'Preamble Detect' circuit, hold circuit 124 may assert the 'Hold' signal, thereby causing frequency difference circuit 125 to freeze the control voltage at its current level and thus open the AFC loop. Assertion of the 'Preamble Detect' signal also causes timer 133 to initiate free-running operation (block 320).

During the initial portion of the AFC procedure, BCR circuit 128 may achieve lock with the preamble and may thus recover and output the bit clock. When the 'Preamble Detect' is asserted, the selection input to multiplexer 129 responds to the change of state by selecting the bit clock for output to frequency difference circuit 125. This does not initially affect the operation of the AFC loop, as the 'Hold' signal remains asserted while timer 133 is still running (i.e. prior to the predetermined time elapsing; block 325 the "No" path). It is noted that embodiments are possible and contemplated wherein a 'Lock' signal is asserted by BCR circuit 128 and is used in lieu of the 'Preamble Detect' signal.

When the predetermined time has elapsed (block 325, the "Yes" path) timer 133 asserts its output and thus causes the de-assertion of the 'Hold' signal. Responsive to the de-assertion of the 'Hold' signal, the AFC loop is closed again (block 330). When the 'Hold' signal is de-asserted, frequency difference circuit 125 is enabled to change the control voltage. During this portion of the operation, the bit clock is provided to frequency difference circuit 125 via multiplexer 129. The control voltage and variation thereof may at this point depend on the difference between the frequency of the bit clock and the frequency indicated by frequency detector 124. The difference between the frequency of the bit clock signal and the desired frequency of the mixer output signal may continue to be reduced when the AFC loop is closed during this portion of the AFC procedure.

The reduction of error between the desired and actual frequencies may be enhanced by providing the bit clock to frequency difference circuit 125. Data sampled in accordance with the bit clock (by bit slicer 131) may be sampled near the peaks or troughs of the incoming signal. In contrast, data sampled in accordance with the NCO clock, prior to preamble detection, may be sampled closer to the zero crossings of the incoming signal. Sampling errors may be less severe when the sampling occurs near the peaks/troughs, which is enabled by operation synchronized by the bit clock. Accordingly, the method described herein contemplates using the bit clock for the latter portion of the AFC procedure to more accurately fine-tune receiver 12 to the desired frequency.

Operation during the second portion of the AFC procedure may continue while the preamble is still being received, prior to detection of its end (block 335, the "No" path). Upon detecting the end of the preamble (block 335, the "Yes" path), the AFC loop may again be frozen (i.e. opened), and may remain so for the remainder of the incoming frame/packet (block 340). The AFC loop may be frozen responsive to assertion of the 'Preamble End' signal by preamble circuit 132, which in turn causes hold circuit 134 to assert the 'Hold' signal. In an alternative embodiment, the AFC loop may remain closed until the end of the frame/packet. In such embodiments, blocks 335 and 340 may be eliminated.

After the remainder of the packet has been received, preamble circuit 132 may de-assert both the 'Preamble Detect' and 'Preamble End' signals and may also reset timer 133. Assuming a synchronization word is detected in the frame/packet (block 342, the "Yes" path), de-assertion of 'Preamble Detect' and 'Preamble End' signals causes de-assertion of the 'Hold' signal, and the AFC loop is again closed (block 345). Furthermore, the state of the select input to multiplexer 129 is again toggled to select the NCO clock. The method then returns to block 310, and begins for the next received frame/packet. If the synchronization word is not detected within a predetermined time interval (block 342, the "No" path), then upon expiration of that time interval, the clock source may be switched back to the NCO clock (block 350). At this time, the AFC loop may be closed without any additional waiting for detection of the synchronization word. In embodiments in which detection of the synchronization word is sought within the predetermined time interval, hold circuit 134 of receiver 12 may include an additional timer or additional logic to enable timer 133 to be used to determine the second time interval. Moreover, additional logic may be present within one of the circuits shown (e.g., in bit slicer 131) or elsewhere that is configured to search for and detect the synchronization word.

The AFC procedure is further illustrated graphically by FIG. 4. As shown in FIG. 4, the reception of a packet may be divided into four distinct phases, two of which include the AFC loop being closed, and two of which include the AFC loop being open. The initial portion occurs when the preamble is being received, but has not yet been detected. During this portion, the NCO clock signal is provided to frequency difference circuit 125, while the 'Preamble Detect', 'Preamble End', and 'Hold' signals are de-asserted.

Upon detection of the preamble by preamble circuit 132, the first phase ends and the second phase begins. The end of the first phase and beginning of the second phase occurs responsive to assertion of the 'Preamble Detect' signal, which in turn causes the 'Hold' signal to be asserted. When the 'Hold' signal is asserted, the AFC loop is opened in the manner described above, and remains so until timer 133 indicates that the predetermined time has elapsed. Upon timer 133 providing such an indication, the second phase ends and the third phase beings with the de-assertion of the 'Hold' signal. During the third phase of operation, the bit clock recovered by BCR circuit 128 is provided to frequency difference circuit 125 and the AFC procedure continues to adjust the frequency of the mixer output signal and thus fine-tune receiver 12. When the end of the preamble is detected, the third phase ends and the fourth phase begins in accordance with the assertion of the 'Preamble End' signal. This in turn results in the 'Hold' signal being re-asserted, thereby opening the AFC loop once again. During the fourth phase, which lasts until the end of the frame/packet, the AFC loop remains open. The rest of the packet/frame is received during this phase. In the illustrated example, the remainder of the packet/frame includes a synchronization word and a payload. However, the exact format of the packet/frame subsequent to the preamble may vary from one embodiment to the next. At the end of the frame/packet, the 'Preamble Detect', 'Preamble End', and 'Hold' signals may be de-asserted, and the reception of the next packet may commence. In an alternative embodiment, the end of the preamble does not cause the loop to freeze. Accordingly, the 'Hold' signal is not asserted in such an embodiment, and the AFC procedure may continue throughout the remainder of the packet/frame. The timing of the 'Hold' signal for the alternate embodiment is thus also illustrated in FIG. 4.

FIG. 5 is a graphic illustration of the difference in the error achieved by sampling data near the zero-crossings vs. sampling near peaks/troughs of an incoming signal. In the illustrated example, samples occur approximately two bit-times apart from each others. The indicated samples occurring near the zero-crossings may represent an example of samples that are synchronized to the NCO clock during the first portion of the AFC procedure. During this portion of the AFC procedure, it is not known how much time actually elapses during two bit-times, and thus the duration between two samples may not be exactly two bit-times. The samples may end up occurring near the zero crossings where the slope of the signal is greater. This may in turn lead to a greater error, as indicated by $\Delta A$.

The indicated samples occurring near the peaks in this example are also spaced by approximately two bit-times. However, these samples are synchronized to the bit clock recovered by BCR circuit 128. The duration of the two-bit times may be more accurately reflected by the period of the bit clock, and thus the samples may occur near the peaks instead of near the zero crossings. The slope difference of any two such samples is less in this example. The error, $\Delta B$, is also less as a result.

In general, using the NCO clock during the first portion of the AFC procedure may allow for coarse-grain tuning of the mixer output frequency. Using the recovered bit clock during the second portion of the AFC procedure may allow for more fine-grain tuning of the mixer output frequency, more closely matching it to the desired frequency. This may in turn improve receiver sensitivity and allow for more accurate reception of incoming data and higher performance overall.

Although the description of exemplary embodiments refers to "logic 0" and "logic 1," other Boolean logic representations may be used, such as negative or inverted logic, as persons of ordinary skill in the art understand. Furthermore, the figures present signal flow and functionality, and not necessarily actual implementation. Accordingly, exemplary embodiments may implement various functions using hardware, software, and/or firmware. The choice of implementation depends on factors such as specifications and desired performance, available technology, flexibility vs. speed trade-off, etc., as persons of ordinary skill in the art understand.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method comprising:
   receiving a radio signal using a radio receiver;
   detecting a preamble in the radio signal;
   responsive to detecting the preamble, freezing a control voltage of an automatic frequency compensation (AFC) loop of the radio receiver for a predetermined time interval;
   switching, using a multiplexer and responsive to freezing the control voltage, a clock source of the AFC loop from a first clock circuit configured to provide a first clock signal to a second, different clock circuit configured to provide a second clock signal; and
   subsequently unfreezing the control voltage of the AFC loop responsive to an indication that the predetermined time interval has elapsed.

2. The method as recited in claim 1, further comprising:
   determining a first frequency difference indicative of a difference between a frequency of a mixer output signal and a receiver channel filter center frequency when providing the first clock signal to the AFC loop; and
   determining a second frequency difference indicative of a difference between the frequency of the mixer output signal and the receiver channel filter center frequency when providing the second clock signal to the AFC loop.

3. The method as recited in claim 2, further comprising:
   adjusting the control voltage based on the first frequency difference when providing the first clock signal to the AFC loop;
   adjusting the control voltage based on the second frequency difference when providing the second clock signal to the AFC loop; and
   adjusting a frequency of a periodic signal output by a local oscillator based on the control voltage.

4. The method as recited in claim 3, further comprising providing the periodic signal to a mixer, wherein the mixer is further coupled to receive the radio signal and is configured to mix the periodic signal and the radio signal to produce the mixer output signal.

5. The method as recited in claim 2, further comprising a bit clock recovery circuit recovering the second clock signal from the radio signal.

6. The method as recited in claim 5, further comprising demodulating the mixer output signal, wherein said demodulating is synchronized to the second clock signal.

7. The method as recited in claim 5, further comprising sampling data contained in the radio signal at one of the following:
   an approximate peak of a modulation signal;
   an approximate minimum of the modulation signal.

8. The method as recited in claim 1, further comprising:
   activating a timer responsive to detecting the preamble, the timer indicating when the predetermined time interval has elapsed subsequent to detection of the preamble; and re-freezing the control voltage of the AFC loop responsive to detecting an end of the preamble.

9. The method as recited in claim 1, further comprising:
determining if a synchronization word is detected within a second time interval subsequent to detecting an end of the preamble; and
switching the clock source from the second clock signal to the first clock signal responsive to determining that the synchronization word has not been detected within the second time interval.

10. An apparatus comprising:
an automatic frequency compensation (AFC) loop coupled to receive a radio signal, wherein the AFC loop includes a frequency difference circuit;
a multiplexer coupled to provide one of a first clock signal from a first clock circuit or a second clock signal from a second, different clock circuit to the frequency difference circuit; and
a preamble circuit configured to detect a beginning and an end of a preamble carried in the radio signal and coupled to provide a selection signal to the multiplexer;
wherein the preamble circuit is configured to change a state of the selection signal to cause the multiplexer to switch from providing the first clock signal to providing the second clock signal to the AFC loop subsequent to detecting the preamble.

11. The apparatus as recited in claim 10, further comprising a hold logic circuit, wherein the frequency difference circuit is configured to freeze the AFC loop responsive to the hold logic circuit asserting a hold signal and unfreeze the AFC loop responsive the hold logic circuit de-asserting the hold signal.

12. The apparatus as recited in claim 11, wherein the hold logic circuit is configured to:
assert the hold signal responsive to the preamble circuit detecting the preamble;
initiate operation of a timer responsive to the preamble circuit detecting the preamble;
de-assert the hold signal responsive to the timer indicating a specified amount of time has elapsed from detection of the preamble signal; and
re-assert the hold signal responsive to the preamble circuit detecting an end of the preamble.

13. The apparatus as recited in claim 10, wherein the frequency difference circuit is configured to generate a control voltage based on a difference between a frequency of a mixer output signal and a receiver channel filter center frequency when providing the first clock signal to the AFC loop, and wherein the AFC loop includes a local oscillator configured to generate a periodic signal, wherein a frequency of the period signal is based on the control voltage.

14. The apparatus as recited in claim 13, wherein the AFC loop includes:
a mixer coupled to receive the radio signal and the periodic signal, wherein the mixer is configured to output the mixer output signal at a frequency dependent on a frequency of the radio signal and the frequency of the periodic signal;
a filter configured to perform bandpass filtering of the mixer output signal; and
a frequency detector coupled to receive a bandpass filtered version of the mixer output signal from the filter, wherein the frequency detector is configured to detect the frequency of the mixer output signal; and
wherein the frequency difference circuit is coupled to receive an indication of the frequency of the mixer output signal from the frequency detector.

15. The apparatus as recited in claim 14, wherein the filter is configured such that its bandwidth is reduced responsive to detection of the preamble.

16. The apparatus as recited in claim 13, further comprising:
a numerically control oscillator configured to generate the first clock signal; and
a bit clock recovery circuit coupled to the AFC loop, wherein the bit clock recovery circuit is configured to recover the second clock signal from the preamble and further configured to output the second clock signal;
wherein the multiplexer is configured to provide one of the first clock signal and the second clock signal to the AFC loop.

17. The apparatus as recited in claim 16, further comprising a bit slicer coupled to receive the mixer output signal from the AFC loop and configured to sample data from the mixer output signal in synchronization with the second clock signal, wherein the bit slicer is configured to determine, for each sample, whether a sampled portion of the mixer output signal contains a logic 1 or a logic 0.

18. The apparatus as recited in claim 14, further comprising a low noise amplifier (LNA) configured to receive the radio signal from an antenna, wherein the LNA is configured to amplify the radio signal and coupled to provide an amplified version of the radio signal to the mixer.

19. A radio receiver comprising:
a frequency difference circuit coupled to receive an indication of a frequency of a filtered intermediate frequency (IF) signal and further coupled to receive one of a first clock signal or a second clock signal from a multiplexer, wherein the frequency difference circuit is configured to determine a difference between the frequency of the filtered IF signal and a frequency of the one of the first clock signal and the second clock signal and further configured to generate a control voltage based on the difference, wherein a local oscillator is configured to output a periodic signal at a frequency dependent on the control voltage;
a demodulator configured to demodulate the filtered IF signal and to provide an output data stream; and
a preamble circuit configured to detect a preamble in the output data stream, wherein the preamble circuit is configured to cause the multiplexer to provide the first clock signal to the frequency difference circuit, from a numerically controlled oscillator, prior to detecting the preamble and further configured to cause the multiplexer to provide the second clock signal, from a bit clock recovery circuit, to the frequency difference circuit responsive to detecting the preamble.

20. The radio receiver as recited in claim 19, wherein the bit clock recovery circuit is configured to generate the second clock signal based on modulating data in the IF signal, wherein a demodulation circuit is configured to demodulate the filtered IF signal in synchronization with the second clock signal;
wherein the radio receiver further comprises a hold circuit configured to cause the frequency difference circuit to maintain the control voltage for a predetermined duration responsive to the preamble circuit detecting the preamble and further configured to cause the frequency difference circuit to maintain the control voltage for a remainder of a data frame responsive to the preamble circuit detecting an end of the preamble, wherein the frequency difference circuit is configured to vary the control voltage in accordance with a frequency difference between the filtered IF signal and the second clock signal subsequent between an end of the predetermined duration and the detecting of the end of the preamble.

21. The apparatus as recited in claim 10, wherein the first clock circuit is a numerically controlled oscillator, and wherein the second clock circuit is a bit clock recovery circuit.

\* \* \* \* \*